US008659901B2

(12) United States Patent
MacManus et al.

(10) Patent No.: US 8,659,901 B2
(45) Date of Patent: Feb. 25, 2014

(54) ACTIVE ANTENNA ARRAY HEATSINK

(75) Inventors: Gerard MacManus, Foothill Ranch, CA (US); Devadas E. Dorai-Raj, Newport Beach, CA (US); James Dillon Kirchhofer, Mission Viejo, CA (US)

(73) Assignee: P-Wave-Holdings, LLC, Los Angeles, CA (US)

( * ) Notice: Subject to any disclaimer, the term of this patent is extended or adjusted under 35 U.S.C. 154(b) by 19 days.

(21) Appl. No.: 13/012,582

(22) Filed: Jan. 24, 2011

(65) Prior Publication Data

US 2011/0188205 A1 Aug. 4, 2011

Related U.S. Application Data

(60) Provisional application No. 61/301,587, filed on Feb. 4, 2010.

(51) Int. Cl.
*H05K 7/20* (2006.01)
(52) U.S. Cl.
USPC ............. 361/709; 361/679.46; 361/679.51; 361/703; 361/715; 343/700 R

(58) Field of Classification Search
USPC ............ 361/676–678, 679.46–679.54, 361/688–697, 701–704, 707–711, 714–720, 361/752
See application file for complete search history.

(56) References Cited

U.S. PATENT DOCUMENTS

| | | | | |
|---|---|---|---|---|
| 5,063,475 | A * | 11/1991 | Balan | 361/679.49 |
| 7,129,908 | B2 * | 10/2006 | Edward et al. | 343/878 |
| 7,443,354 | B2 * | 10/2008 | Navarro et al. | 343/777 |
| 7,508,338 | B2 * | 3/2009 | Pluymers et al. | 342/175 |
| 7,898,810 | B2 * | 3/2011 | Mason et al. | 361/717 |
| 7,940,524 | B2 * | 5/2011 | Rummel et al. | 361/689 |
| 2005/0146479 | A1 * | 7/2005 | Stenger et al. | 343/772 |
| 2008/0055847 | A1 * | 3/2008 | Belady et al. | 361/687 |
| 2008/0156462 | A1 * | 7/2008 | Arik et al. | 165/80.4 |
| 2008/0204350 | A1 * | 8/2008 | Tam et al. | 343/872 |
| 2010/0311353 | A1 | 12/2010 | Teillet | |
| 2011/0255237 | A1 * | 10/2011 | Doll | 361/679.46 |

* cited by examiner

*Primary Examiner* — Courtney Smith
(74) *Attorney, Agent, or Firm* — Verrill Dana, LLP; Chris A. Caseiro

(57) ABSTRACT

An active array heat sink cooled by natural free convection is disclosed. A long extruded heat sink is partitioned into multiple, shorter zones separated by gaps having horizontal baffles. The gaps and baffles serve to act as air vents and air inlets for the convection currents. As such, the heat transfer for the overall heat sink is improved because hot convection currents are vented and replaced by cool ambient air along the length of the heat sink.

20 Claims, 7 Drawing Sheets

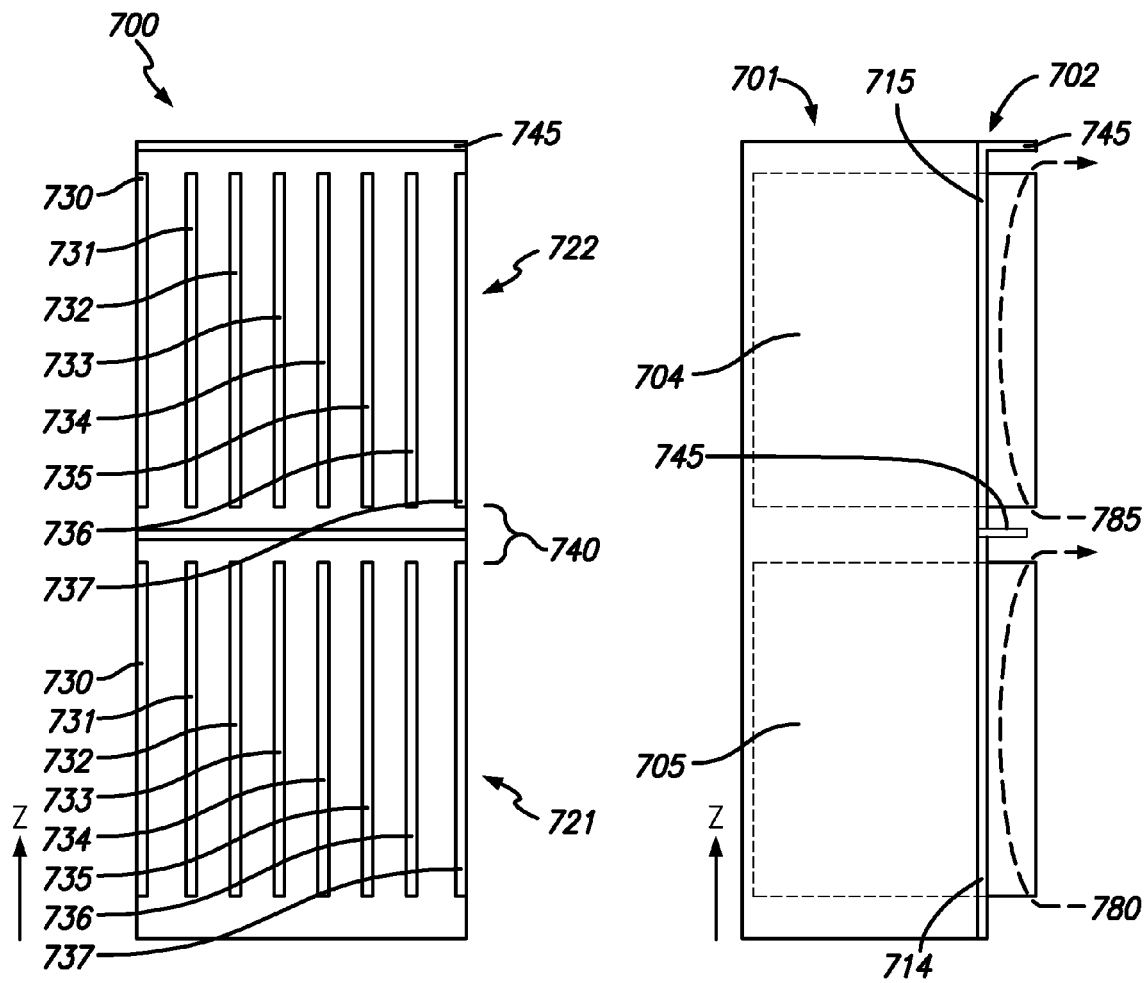
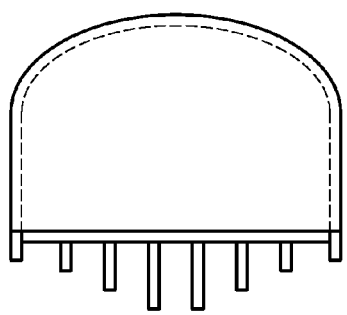

ACTIVE ANTENNA ARRAY HEATSINK

RELATED APPLICATION INFORMATION

The present application claims priority under 35 U.S.C. Section 119(e) to U.S. Provisional Patent Application Ser. No. 61/301,587 filed Feb. 4, 2010, the disclosure of which is incorporated herein by reference in its entirety.

BACKGROUND OF THE INVENTION

1. Field of the Invention

The present invention relates generally to the thermal management of wireless communication base stations and, more particularly, to the thermal management of active antenna arrays connected to base stations or access points through a wired communication channel. More particularly, the invention relates to a system for cooling the active electronics that are housed in the antenna enclosure.

2. Description of the Prior Art and Related Background Information

Modern active antenna arrays typically comprise integrated active electronics used to up-convert digital to RF and down-convert RF to digital that reside at the antenna. These active electronics generate large amounts of waste heat which must be removed to preserve the efficiency, operating characteristics, and life of the electronic components.

Accordingly, a need exists to improve the heat transfer performance for active antenna arrays.

SUMMARY OF THE INVENTION

In the first aspect, the present invention provides an electronics assembly comprising a first finned structure having a first support plate and a plurality of substantially vertical first fins that extend from a surface of the first support plate. A first electronics module is mounted to an opposite surface of the first support plate. The electronics assembly further comprises a second finned structure having a second support plate and a plurality of substantially vertical second fins that extend from a surface of the second support plate. The second finned structure is positioned above the first finned structure. A second electronics module is mounted to an opposite surface of the second support plate. The electronics assembly further comprises a horizontal baffle placed in a gap between the first finned structure and the second finned structure.

In a preferred embodiment of the electronics assembly, the horizontal baffle is further configured for substantially blocking the air flow through the first finned structure from entering the second finned structure. The first support plate is preferably coupled with the second support plate or is formed as an integral structure therewith. The electronics assembly preferably further comprises an upper horizontal baffle positioned above the second finned structure, where the upper horizontal baffle forms an outlet for the air flow through the second finned structure, and a lower horizontal baffle positioned below the first finned structure, where the lower horizontal baffle forms an inlet for the air flow through the first finned structure. At least one of the first electronics module and the second electronics module preferably further comprises an RF power amplifier circuit and an antenna. The first and second fin structures are preferably composed of aluminum. The first and second finned structures are preferably formed by a single metal extrusion.

In another aspect, the present invention provides a power amplifier and antenna assembly, comprising a heat sink having a support plate and a plurality of vertical fins that extend outward from a surface of the support plate. The heat sink further comprises a plurality of cross cut horizontal channels in which at least a portion of the plurality of fins are removed to form a plurality of gaps and a plurality of fin module zones between adjacent gaps. The heat sink further comprises a plurality of horizontal baffles each of which is positioned in a respective gap of the plurality of gaps. A plurality of electronic modules is thermally coupled to an opposite surface of the support plate, where at least one of the plurality electronic modules further comprises an RF amplifier circuit. At least one of the plurality of electronic modules is coupled to an antenna.

In a preferred embodiment of the present invention, each horizontal baffle is further configured for defining an outlet for air flow passing through a lower fin module zone and an inlet for air flow passing through an adjacent upper fin module zone. Each horizontal baffle is preferably further configured for substantially blocking the outlet air flow passing through the lower fin module from entering the adjacent upper fin module zones. Each electronic module of the plurality of electronic modules is preferably positioned adjacent to a corresponding fin module zone. At least one of the fin module zones preferably has a length differing from the other fin module zones. The length of each of the gaps is preferably in the range of approximately 45 millimeters to approximately 50 millimeters. The plurality of fin module zones preferably further comprises seven fin module zones. The length of the heat sink is preferably greater than 1 meter. The heat sink preferably receives from the plurality of electronic modules and thermally transfers to surrounding air more than 100 Watts of heat. The heat sink preferably receives from the plurality of electronic modules and thermally transfers to surrounding air more than 200 Watts of heat. The heat sink is preferably formed by a single metal extrusion.

In another aspect, the present invention provides a method of passive cooling an active antenna array having a plurality of vertically stacked electronic modules and a heat sink having a support plate and a plurality of vertical fins partitioned into a plurality of fin module zones. The method comprises receiving thermal energy from the plurality of vertically stacked electronic modules by the support plate of the heat sink, and communicating the thermal energy received in the support plate to corresponding fin module zones. The method further comprises communicating the thermal energy received in the corresponding fin module zones to air in contact with the corresponding fin module zones, receiving ambient air into a lower region of each fin module zone, and venting heated air at an upper region of each fin module zone employing baffles for deflecting convective flow of heated air.

In a preferred embodiment of the present invention further includes substantially blocking the heated air of a lower fin module from entering an upper adjacent fin module zone employing said baffles.

Further features and aspects of the invention are set out in the following detailed description.

BRIEF DESCRIPTION OF THE DRAWINGS

FIG. 7A is a front view of an alternate embodiment of an active antenna array.

FIG. 7B is a side view of the array depicted in FIG. 7A.

FIG. 7C is a top, cross-sectional view of the array depicted in FIG. 7A.

DETAILED DESCRIPTION OF THE INVENTION

It is an object of the present invention to improve the heat transfer performance of an active antenna array heat sink cooled by natural free convection. An active antenna array typically has multiple power amplifiers generating waste heat that are positioned above each other and are enclosed in tall, vertical housings that may be one meter or more in length. Because of this length, merely employing continuous, vertical fins would not provide adequate heat transfer for the amplifiers positioned toward the top of the housing because the temperature of the convection currents near the top of the enclosure would be significantly greater than the ambient temperature. Embodiments of the present invention provide superior heat transfer by partitioning the long heat sink into multiple, shorter zones separated by gaps having horizontal baffles. The gaps and baffles serve as air vents and air inlets for the convection currents within each zone. As such, the heat transfer for the overall heat sink is improved because hot convection currents are vented and replaced by cool ambient air along the length of the heat sink.

Modern wireless communication systems are converging as components that were traditionally separated across the access network and the antenna, are now becoming more integrated. The Active Antenna Array integrates active electronics used to up-convert digital to RF and down-convert RF to digital. The active electronics now reside at the antenna.

The electronic components must be cooled to ensure operation of the product over its lifetime. There are several approaches for cooling the electronic components including employing forced convection cooling using fans, employing heat transportation such as through heat pipes and bubble pumps, and through employing free convection.

Each of these approaches has competing advantages and disadvantages. For example, the advantages of employing forced convection cooling is reduced size and weight, but increased noise and diminished reliability make this approach disadvantageous. Likewise, the disadvantages of heat transportation and free convection cooling is reduced size, however, the heat transportation also carries an additional reliability disadvantage. Hence, the best compromise is free convection cooling. Heat sinks employing natural free convection offer reduced size and weight.

Figure 1:
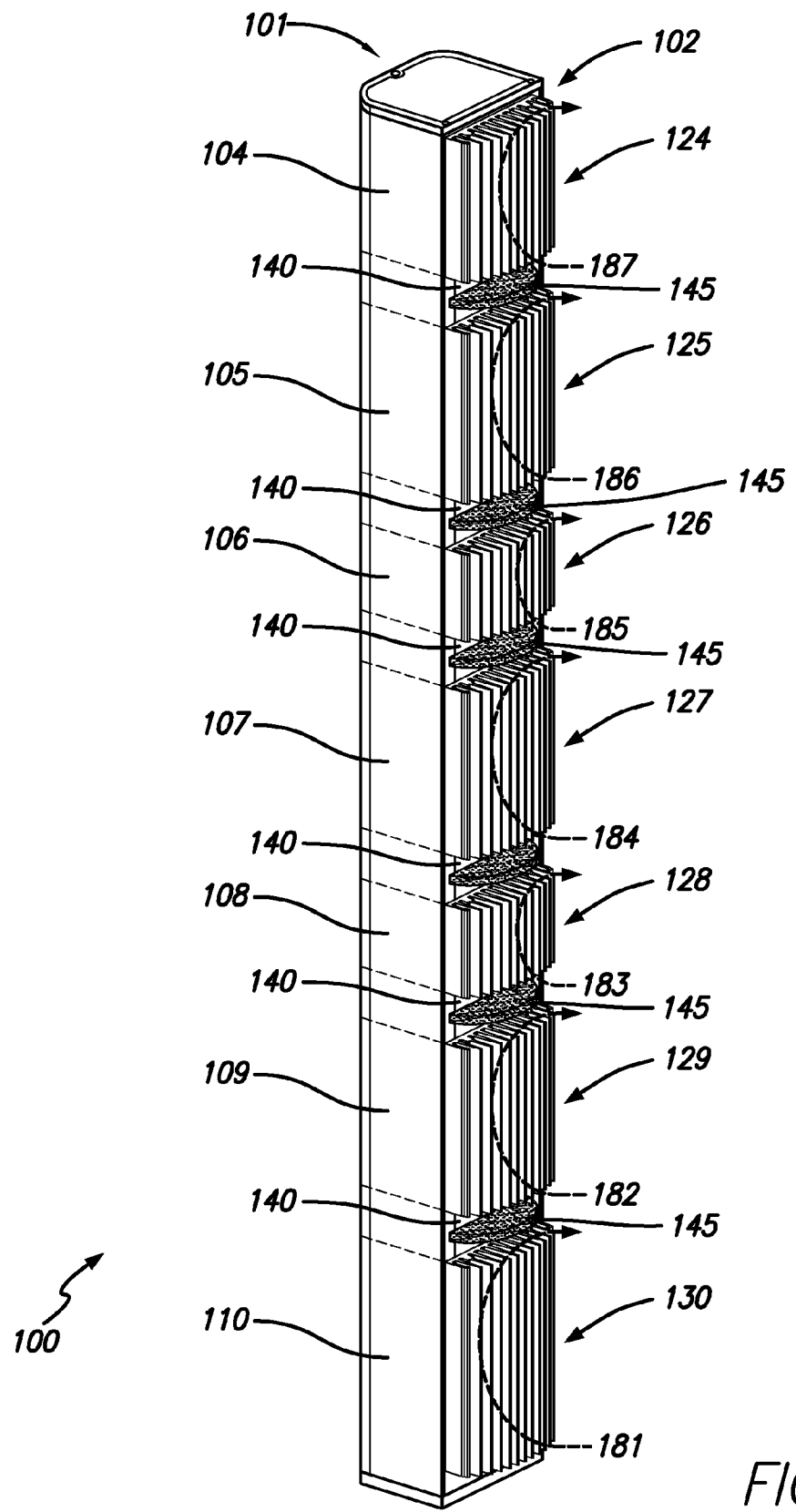
FIG. 1 is a perspective view of an active antenna array employing a heat sink in accordance with the present invention.

FIG. 1 is a perspective view of an active antenna array 100 having an antenna module housing 101 and a heat sink 102 in accordance with the present invention. The active antenna array 100 may have a length in excess of one meter. The antenna module housing has electronic modules 104-110 which generate waste heat during operation. Each of these electronic modules 104-110 are thermally coupled to heat sink 102. The electronic modules 104-110 are preferably positioned adjacent to the corresponding fin module zones 124-130.

As noted above, the electronic modules 104-110 may have an RF amplifier circuit and may be coupled to an antenna. In such case, the antenna array 100 may include the disclosure provided by U.S. patent application Ser. No. 12/795,577, U.S. Publication No. 2010/0311353, to Teillet et al., which is incorporated by reference in its entirety as though fully set forth herein.

Figure 2:
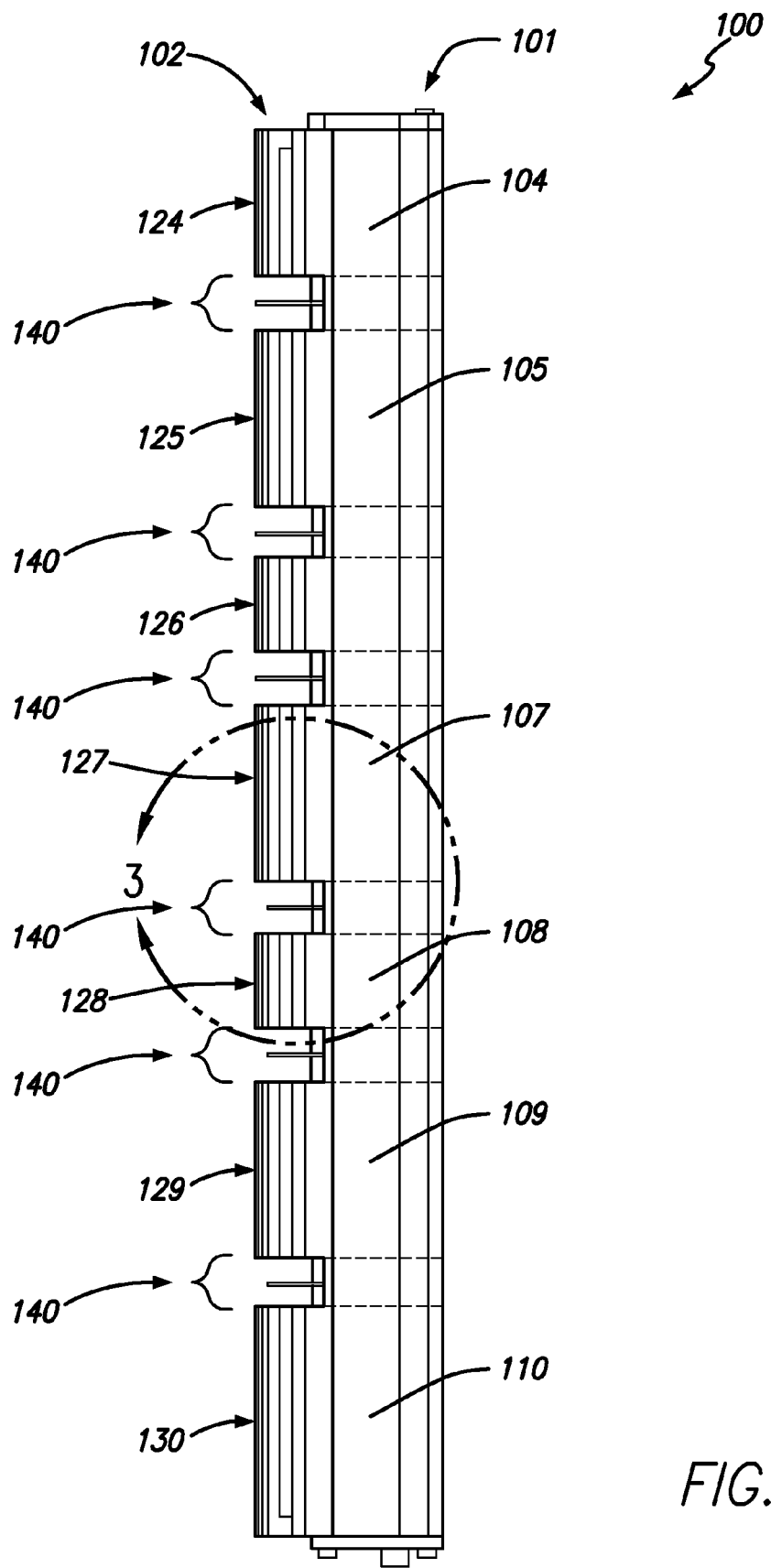
FIG. 2 is a side view of an active antenna array employing a heat sink.
Figure 5:
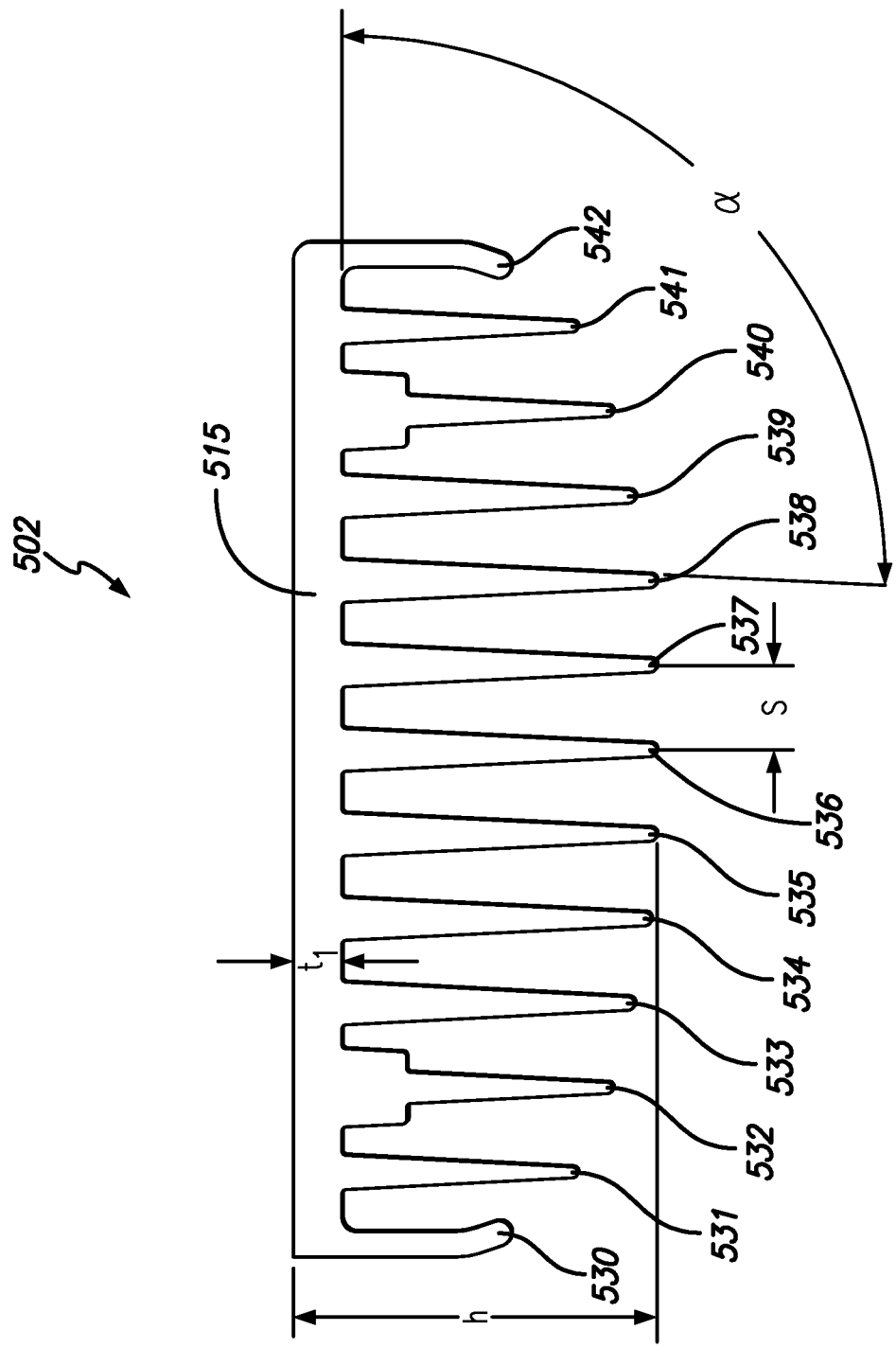
FIG. 5 is a cross-sectional view of an extrusion illustrating the shape and layout of the fins of the preferred embodiment of the heat sink.

The heat sink 102 is preferably fabricated from a single, finned metal extrusion. The finned extrusion has a support plate 515 and a series of fins 530-542 as depicted in FIG. 5 for example. As depicted in FIG. 2, the heat sink 102 has a series of cross cut gaps 140 in which at least a portion of the fins are removed to form fin module zones 124-130. Baffles 145 are positioned in each of the gaps 140. The baffles 145 are preferably placed in the center of the gaps 140.

Heat sink 102 relies on natural free convection to transfer the waste heat to the surrounding air. As air is heated by the vertical fins, the localized density of the air decreases which increases the relative buoyancy of the air. As a result, the heated air rises and is replaced by surrounding cooler ambient air. This process continues as the cooler air is heated by the vertical fins, which, in turn, creates a convection current that transfers the heat energy from the bottom of a convection cell to the top. Because the convection current is driven by the relative buoyancy, the optimal heat transfer occurs when the fins are vertical.

For example, as depicted in FIG. 1, air flow 181 enters the bottom of fin module zone 130 and is heated by the fins. The air flow 181 rises and flows upward though the fin module zone 130. When the air flow 181 exits out of fin module zone 130, the heated air flow 181 is deflected outward from the heat sink 102 by the presence of baffle 145. The baffle 145 between fin module zone 130 and fin module zone 129 also acts as an inlet for receiving cooler ambient air to form air flow 182 which rises through fin module zone 129. Likewise, air flow 183 flows through and cools fin module zone 128, air flow 184 flows through and cools fin module zone 127, air flow 185 flows through and cools fin module zone 126, air flow 186 flows through and cools fin module zone 125, and air flow 187 flows through and cools fin module zone 124.

Figure 3:
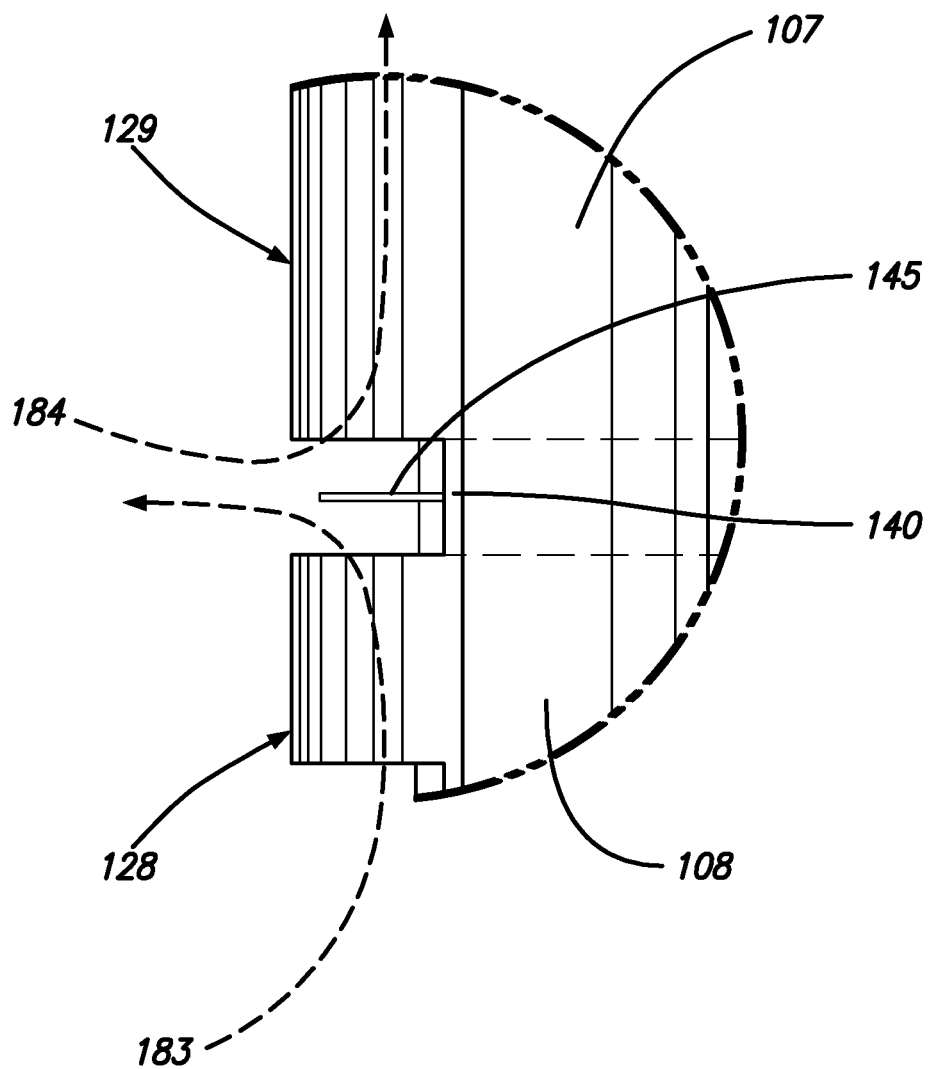
FIG. 3 is a side view of a portion of the active antenna array of FIG. 2.

Referring to FIG. 3, a side view of a portion of the active antenna array of FIG. 2 is presented. Air flow 183 flows though and cools fin module zone 128 and is deflected out of the heat sink 102 by baffle 145. Cooler ambient air enters fin module 129 to form air flow 184. The temperature of the air flow 184 entering fin module zone 129 is 10° C. cooler than the temperature of the air flow 183 leaving fin module zone 128. The active antenna array 100 preferably operates in ambient temperatures in the range of approximately −40° C. to approximately 55° C.

Figure 4:
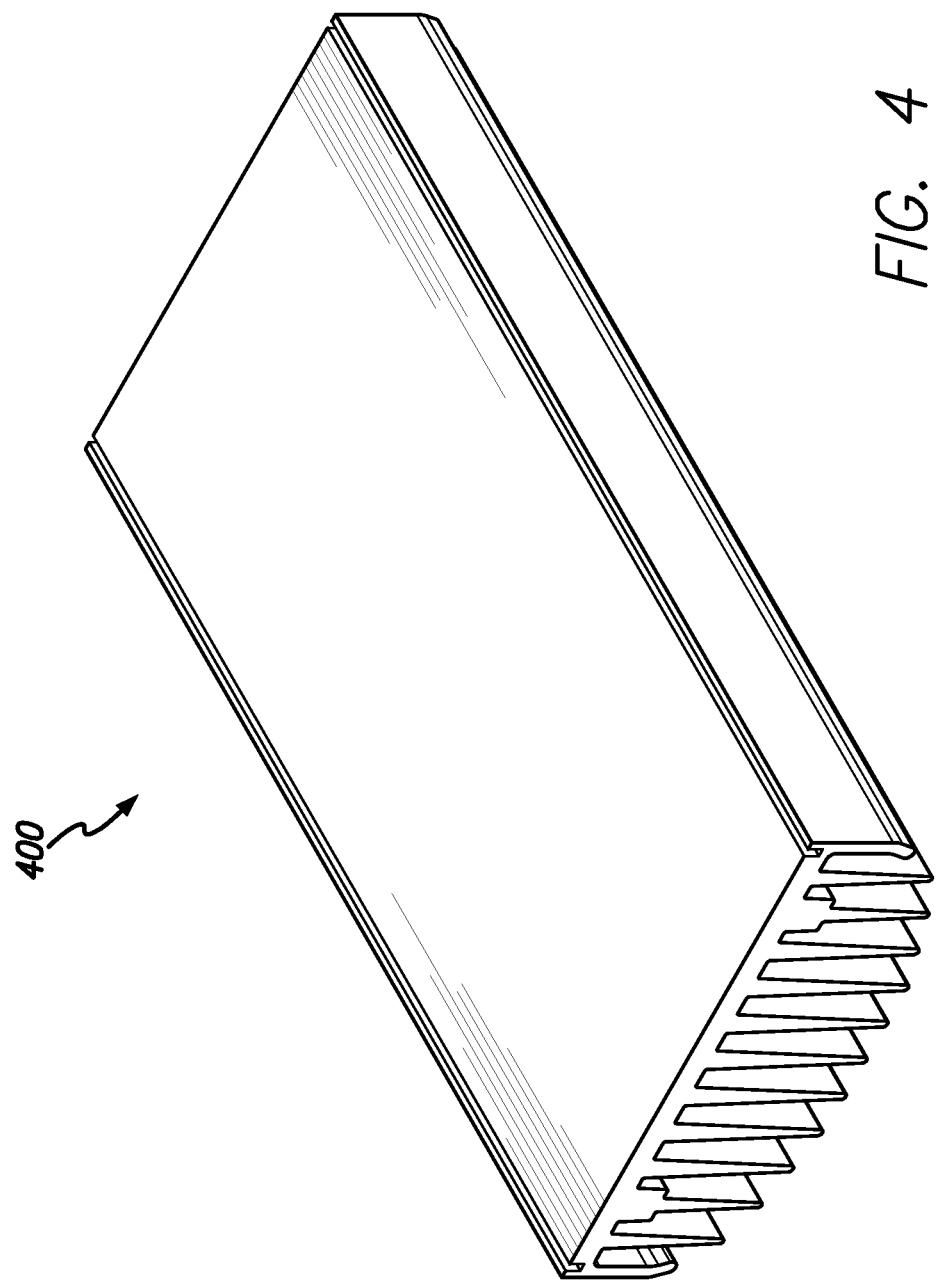
FIG. 4 is a top, perspective view of an extrusion that is machined to form a preferred embodiment.

Referring to FIG. 4, the heat sink 102 is preferably fabricated from an extruded length of aluminum alloy 400 which is then machined or cross cut at intervals. Heat sink 102 may be fabricated using numerous manufacturing techniques including extruding, sand and die casting, injection molding, and machining. The baffles 145 could be fabricated by similar methods to the heat sink. Also, the baffles 145 could be integrated into the heat sink 102 so as to be produced as a single structure. In this instance, the baffles 145 are preferably stamped and are assembled in the cross cuts gaps 140 that have been machined into the heat sink 102.

The parameters for optimizing the heat sink performance include the number of fins, the height of fins, the position of cross cuts, the width of cross cuts, the number of cross cuts, the shape of leading edge of the fins on air flow entry, the shape of fins on exhaust edge of the fins on air flow exit, and the profile of fin. The baffle features for optimized cooling include the contour on the entry to the heat sink, the contour on exit from the heat sink (in both instances with reference to management of pressure drop seen on entry and exit from the sink), and the side profile of the baffle. At least one of the fin module zones 124-130 may have a length that differs from the other fin module zones. The combination of heat sink profile, cross cut shape, quantity and positions, baffle shape and position, lead to a heat sink that delivers lowest weight for highest temperature drop, in a single assembly.

FIG. 5 is a cross-sectional view of an extrusion illustrating the shape and layout of the fins of the preferred heat sink. Extruded heat sink 502 has a support plate 515. Electronic modules such as those depicted by 104-110 on FIG. 1 are mounted on or are thermally coupled to the top surface of support plate 515. A plurality of fins 530-542 extend from the opposite surface of support plate 515. During operation, the extruded heat sink 502 is oriented with the fins 530-542 in a substantially vertical direction. The waste heat from the electronic modules travels through the support plate 515 and through the fins 530-542. The fins 530-542 in turn heat the air between the fins, which creates convection currents to flow along the length of the fins 530-542.

The center fins are preferably longer than the fins on the ends. For example, the length of fin 535 is greater than the length of fin 534, the length of fin 534 is greater than the length of fin 533, and so forth. The fins preferably have a tapered contour such that the thickness of the fin near the support plate 515 is greater than the thickness of the fin at the end of the fin.

In one non-limiting embodiment, the thickness of the support plate 515 indicated by "$t_1$" is preferably approximately 7.5 millimeters. The separation between adjacent fins indicated by "S" is preferably approximately 13.4 millimeters. Fins 531 through 541 have a tapered profile with a taper angle "a" of preferably approximately 93°. The overall width of the extruded heat sink 502 is preferably approximately 160 millimeters.

Figure 6:
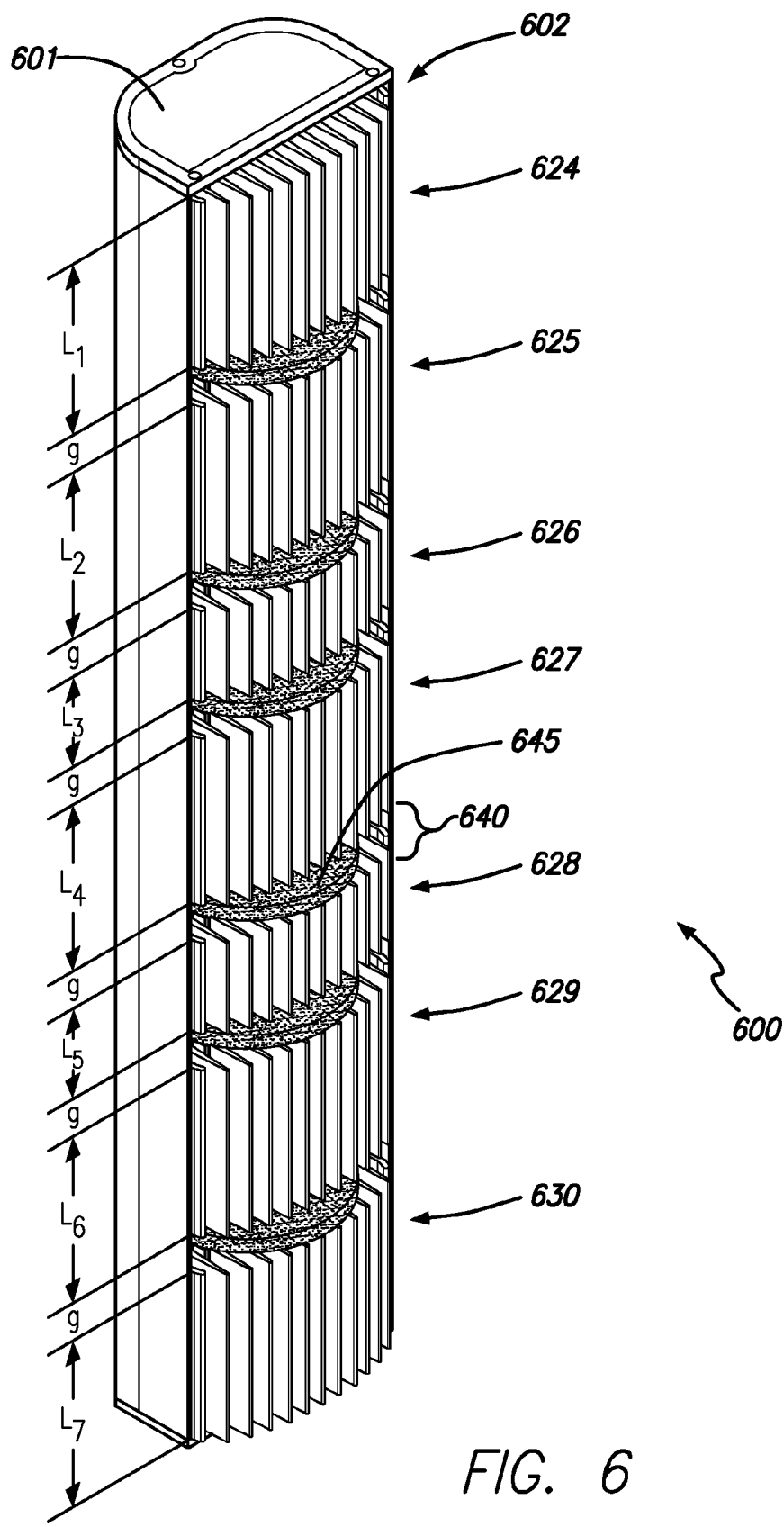
FIG. 6 is a top, perspective view of an active antenna array.

FIG. 6 is a top, perspective view of an active antenna array 600 which was modeled to simulate the heat sink properties. Active antenna array 600 has an antenna module housing 601 holding ten heat-generating electronic modules. Each of the electronic modules is coupled to a corresponding fin module zone 624-630. Fin module zones 625, 627, and 629 are each configured for transferring heat from two heat-generating electronic modules. Fin module zones 624, 626, 628, and 630 are each configured for transferring heat from one of the heat generating electronic modules. Each of fin module zones 624-630 are separated by a gap 640 which holds a horizontal baffle 645.

The simulation was performed using a lumped properties model. The electronic components are modeled as distributed heat loads to analyze the effect of cross cut gaps and baffles. The simulation assumed an ambient temperature of 55° C., which is equivalent to an ambient of 50° C. with a solar load.

Table I presents the length and simulated heat load for the fin module zones 624-630. The length of the gap "g" is approximately 45 to 50 millimeters. The overall length of the heat sink 602 is 1.2 meters.

TABLE I

Dimensions and Heat Load.

| Fin Module Zone | Length $L_i$ (millimeters) | Heat Load (Watts) |
| --- | --- | --- |
| 624 | $L_1 = 125$ | 25 |
| 625 | $L_2 = 145$ | 28.5 |
| 626 | $L_3 = 77$ | 25 |
| 627 | $L_4 = 145$ | 28.5 |
| 628 | $L_5 = 77$ | 25 |
| 629 | $L_6 = 145$ | 49 |
| 630 | $L_7 = 200$ | 30 |

Four simulations were performed to determine the relative heat sink performance for various configurations. Table II presents the results of each of these simulations. The second column of Table II refers to the electronics which are thermally coupled to the respective fin module zones. "CAAM" refers to a common amplifier antenna module, "PSU" refers to a power supply unit, "IPA-D" refers to a downlink integrated phase amplifier, "IPA-U" refers to an uplink integrated phase amplifier, and "TR" refers to a transceiver. A baseline simulation (Sim. 0) modeled the thermal performance of an entire heat sink extrusion without cross cut gaps. The first simulation (Sim. 1) modeled the thermal performance of a heat sink 602 that was machined to form nine 16-millimeter cross cut gaps between each of the ten heat generating electronic modules. The second simulation (Sim. 2) modeled the thermal performance of a heat sink 602 that was machined to form four 16-millimeter cross cut gaps with fins removed in five locations. The third simulation (Sim. 3) modeled the thermal performance of the heat sink 602 having four 16-millimeter cross cuts that were machined in four places, with fins that were removed in five places, and with baffles placed in the five regions where the fins were removed.

The results indicate that the temperature of the fin module zones were essentially identical for the baseline (Sim. 0) and the first (Sim. 1) and second simulations (Sim. 2). However, the introduction of baffles in the third simulation (Sim. 3) resulted in a decrease in temperature for fin modules 627, 628, and 629. These simulations predict that the heat transfer characteristics are improved for a heat sink that is partitioned into shorter, multiple zones with gaps and baffles configured to allow cooler ambient air to cool the fin module zones.

TABLE II

Simulated Fin Module Zone Temperature.

| Fin Module | | Temperature of Fin Module Zone for Each Simulation (° C.) | | | |
| --- | --- | --- | --- | --- | --- |
| Zone | Modules | Sim. 0 | Sim. 1 | Sim. 2 | Sim. 3 |
| 624 | CAAM 6 | 89 | 88 | 88 | 89 |
| 625 | CAAM 5/IPA-D | 92 | 91 | 92 | 93 |
| 626 | CAAM 4 | 94 | 94 | 94 | 94 |
| 627 | CAAM 3/IPA-U | 96 | 96 | 96 | 95 |
| 628 | CAAM 2 | 99 | 99 | 99 | 95 |
| 629 | CAAM 1/PSU | 99 | 100 | 99 | 94 |
| 630 | TR | 85 | 83 | 83 | 84 |

FIGS. 7A, 7B, and 7C present a front, side, and top cross-sectional view respectively of an alternate embodiment of an electronics assembly with plural equal-dimensioned heat sink modules, where each electronics module is coupled to a separate support plate and then stacked to form an assembly such as an active antenna array or other heat generating assemblies. Active antenna array 700 has an antenna module housing 701 and a heat sink 702. Heat sink 702 has a first finned structure 721 and a second finned structure 722. The first finned structure 721 has a first support plate 714 and a plurality of vertical first fins 730-737 extending from a surface of the first support plate 714. The first fins 730-737 are essentially vertical. The second finned structure 722 has a second support plate 715 and a plurality of vertical first fins 730-737 extending from a surface of the first support plate 716. The second finned structure 722 is positioned above and co-linear with respect to the first finned structure 721. Gap 740 separates the first finned structure 721 and the second finned structure. A horizontal baffle 745 is placed in the gap 740 between the first finned structure 721 and the second finned structure 722.

A first electronics module 704 is mounted to an opposite surface of the first support plate 715, and a second electronics module 705 is mounted to an opposite surface of the second support plate 716. At least one of the first electronics module 704 and the second electronics module 705 preferably has an RF power amplifier circuit and is coupled with an antenna.

During operation, both first electronics module 704 and second electronics module 705 generate waste heat. This heat is transferred to the first finned structure 721 and the second finned structure 722 which, in turn, heats fins 730-737. Air flow 780 entering the bottom section of first finned structure 721 is heated and forms a convection current that rises to the top of first finned structure 721. Air flow 780 is then deflected away from the heat sink 702 by baffle 745. Cooler ambient air enters second finned structure 722 and forms an air flow 785 that rises through the second finned structure 722 and is deflected away from heat sink 702 by baffle 745 at the top of the second finned structure 722. Baffle 745 forms an outlet for air flow 780 through the first finned structure 721 and an inlet for air flow 785 through the second finned structure 722. The baffle 745 substantially blocks the air flow 780 passing through the first finned structure 721 from entering the second finned structure 722. The first support plate 714 and the second support 715 is preferably coupled together to form a single support plate. The finned structures are preferably formed from aluminum as a metal extrusion.

The present invention has been described primarily to improve heat transfer performance of a long heat sink by partitioning the heat sink into multiple, separate zones, and placing baffles between the zones to direct hot air away from the heat sink and allow cooler ambient air to enter the upper adjacent zone. In this regard, the assemblies for optimizing heat sink performance through the use of cross cut gaps, multiple finned module zones, and baffles are presented for purposes of illustration and description. Furthermore, the description is not intended to limit the invention to the form disclosed herein. For example, embodiments may comprise various physical forms including discrete finned structures having differing fin structures that are stacked to form a heat sink. Accordingly, variants and modifications consistent with the following teachings, skill, and knowledge of the relevant art, are within the scope of the present invention. The embodiments described herein are further intended to explain modes known for practicing the invention disclosed herewith and to enable others skilled in the art to utilize the invention in equivalent, or alternative embodiments and with various modifications considered necessary by the particular application(s) or use(s) of the present invention.

What is claimed is:

1. An electronics assembly, comprising:
   a first finned structure having a first support plate and a plurality of substantially vertical first fins extending from a surface of the first support plate;
   a first electronics module mounted to an opposite surface of the first support plate;
   a second finned structure having a second support plate and a plurality of substantially vertical second fins extending from a surface of the second support plate, wherein the second finned structure is aligned in series in a passive convective air flow direction above the first finned structure and wherein the first support plate is coupled with the second support plate;
   a second electronics module mounted to an opposite surface of the second support plate; and,
   a horizontal baffle placed in a gap between the first finned structure and the second finned structure.

2. The electronics assembly of claim 1, wherein the horizontal baffle is positioned relative to the first and second finned structures to block a direct convective air flow path through the first finned structure from entering the second finned structure.

3. The electronics assembly of claim 1, wherein the first support plate and the second support plate are formed together as an integral structure.

4. The electronics assembly of claim 1 further comprising:
   an upper horizontal baffle positioned above the second finned structure, wherein the upper horizontal baffle forms an outlet for the air flow through the second finned structure; and,
   a lower horizontal baffle positioned below the first finned structure, wherein the lower horizontal baffle forms an inlet for the air flow through the first finned structure.

5. The electronics assembly of claim 1, wherein at least one of the first electronics module and the second electronics module further comprises an RF power amplifier circuit and an antenna.

6. The electronics assembly of claim 2, wherein the first and second fin structures are composed of aluminum.

7. The electronics assembly of claim 2, wherein the first and second finned structures are formed by a single metal extrusion.

8. A power amplifier and antenna assembly, comprising:
   a heat sink comprising a support plate and a plurality of fins extending in a first direction generally corresponding to passive convective air flow and outward from a surface of the support plate in a second direction, wherein the heat sink further comprises a plurality of cross cut channels in which at least a portion of the plurality of fins are removed to form a plurality of gaps in the first direction and provide a plurality of separate fin module zones arranged in series in the first direction between adjacent gaps;
   a plurality of baffles each of which is positioned in a respective gap of the plurality of gaps; and,
   a plurality of electronic modules thermally coupled to an opposite surface of the support plate, wherein at least one of the plurality electronic modules further comprises an RF amplifier circuit, wherein at least one of the plurality of electronic modules is coupled to an antenna.

9. The power amplifier and antenna assembly of claim 8, wherein the first direction is generally vertical and each baffle is positioned relative to the adjacent upper and lower fin module zones to create an outlet for air flow passing through a lower fin module zone and an inlet for different air to flow through an adjacent upper fin module zone.

10. The power amplifier and antenna assembly of claim 9, wherein each baffle is further positioned to substantially block the outlet air flow passing through the lower fin module from entering the adjacent upper fin module zones.

11. The power amplifier and antenna assembly of claim 8, wherein each electronic module of the plurality of electronic modules is positioned adjacent to a corresponding fin module zone.

12. The power amplifier and antenna assembly of claim 8, wherein at least one of the fin module zones has a length differing from the other fin module zones.

13. The power amplifier and antenna assembly of claim 8, wherein the length of each of the gaps is in the range of approximately 45 millimeters to approximately 50 millimeters.

14. The power amplifier and antenna assembly of claim 8, wherein the plurality of fin module zones further comprises seven fin module zones.

15. The power amplifier and antenna assembly of claim 8, wherein the length of the heat sink is greater than 1 meter.

16. The power amplifier and antenna assembly of claim 15, wherein the heat sink receives from the plurality of electronic modules and thermally transfers to surrounding air more than 100 Watts of heat.

17. The power amplifier and antenna assembly of claim 15, wherein the heat sink receives from the plurality of electronic modules and thermally transfers to surrounding air more than 200 Watts of heat.

18. The power amplifier and antenna assembly of 8, wherein the heat sink is formed by a single metal extrusion.

19. A method of passive cooling an active antenna array having a plurality of vertically stacked electronic modules and a heat sink having a support plate and a plurality of vertical fins partitioned into a plurality of fin module zones, the method comprising:

receiving thermal energy from the plurality of vertically stacked electronic modules by the support plate of the heat sink;

coupling the thermal energy received in the support plate to corresponding fin module zones arranged in series in a passive convective air flow direction;

coupling the thermal energy received in the corresponding fin module zones to air in contact with the corresponding fin module zones;

receiving ambient air into a lower region of each fin module zone via passive convection; and, venting heated air at an upper region of each fin module zone employing baffles for deflecting convective flow of heated air.

20. The method of claim 19 further comprising substantially blocking the heated air of a lower fin module from entering an upper adjacent fin module zone employing said baffles.

* * * * *